US006017146A

United States Patent [19]

Masumoto et al.

[11] Patent Number: 6,017,146

[45] Date of Patent: Jan. 25, 2000

[54] ERROR CORRECTION DEVICE

[75] Inventors: Takahiko Masumoto, Ora-gun; Syugo Yamashita, Kadoma; Kazuhiro Kimura, Fukaya; Hiroshi Kaneko, Ora-gun, all of Japan

[73] Assignee: Sanyo Electric Co., Ltd., Osaka, Japan

[21] Appl. No.: 08/654,859

[22] Filed: May 29, 1996

[30] Foreign Application Priority Data

| | | | |
|---|---|---|---|
| May 31, 1995 | [JP] | Japan | 7-134514 |
| May 31, 1995 | [JP] | Japan | 7-134515 |

[51] Int. Cl.[7] .......... H03M 13/00

[52] U.S. Cl. .......... 371/37.06

[58] Field of Search .......... 371/371, 37.06

[56] References Cited

U.S. PATENT DOCUMENTS

| | | | |
|---|---|---|---|
| 4,519,080 | 5/1985 | Snyder | 371/43 |
| 4,763,331 | 8/1988 | Matsumoto | 371/37 |
| 5,432,822 | 7/1995 | Kaewell, Jr. | 375/340 |

FOREIGN PATENT DOCUMENTS

| | | |
|---|---|---|
| 0345986 | 12/1989 | European Pat. Off. . |
| 3827310 | 3/1989 | Germany . |
| 4234603 | 4/1994 | Germany . |

*Primary Examiner*—Stephen M. Baker
*Attorney, Agent, or Firm*—Loeb & Loeb LLP

[57] ABSTRACT

A demodulating circuit demodulates a received signal, and outputs patterns of demodulated data and reliability information bits indicating correctness of the demodulated data. These are supplied to first and second shift registers (4 and 5), respectively. When the number of reliability information bits of Level 1 in the second shift register is a predetermined value or less, a shift operation is repeated a plurality of times. When a reliability information bit of Level 1 is outputted, an error correction control circuit (7) successively outputs all possible bit patterns of the demodulated data An EXOR gate (10) generates all possible patterns of demodulated data An error correcting circuit (11) carries out error correction for all the patterns. When the number is larger than the predetermined value, the error correction is carried out only for the demodulated data supplied from the demodulating circuit in a conventional manner.

9 Claims, 3 Drawing Sheets

| | | TWELFTH BIT ↓ TWENTIETH BIT ↓ |
|---|---|---|
| (a) | DD | 01010101010101011100101100 |
| (b) | D0 | 01010101010101011100001111 |
| (c) | T0 | 00000000000010000001000000 |
| (d) | D1 | 01010101010101011100001111 |
| (e) | D2 | 01010101010111011100001111 |
| (f) | D3 | 01010101010101011100101111 |
| (g) | D4 | 01010101010111011100101111 |
| (h) | DC1 | 01010101010111010000101111 |
| (i) | DC2 | 01010101010101011100101100 |
| (j) | DC3 | 01010101010111010000101111 |

| DEMODULATED OUTPUT | RELIABILITY INFORMATION BIT | RESULT OF CORRECTION | DISTANCE BETWEEN SIGNALS |
|---|---|---|---|
| 0 | 0 | 0 | 0 |
| 0 | 0 | 1 | 3 |
| 0 | 1 | 0 | 1 |
| 0 | 1 | 1 | 2 |
| 1 | 0 | 0 | 3 |
| 1 | 0 | 1 | 0 |
| 1 | 1 | 0 | 2 |
| 1 | 1 | 1 | 1 |

Fig. 4

ERROR CORRECTION DEVICE

BACKGROUND OF THE INVENTION

1. Field of the Invention

The present invention relates to an error correction device for performing error correction of a received signal having an error correcting code (parity), such as a radio data system (RDS) broadcasting signal or FM multiplex broadcasting signal.

2. Description of the Related Art

In the receiving of a broadcasting signal, the received signal generally has noise due to interference, such as fading, occurring in a transmission. Consequently, when the received signal is demodulated to digital data by a demodulating circuit, bits of the demodulated digital data cannot always correctly be judged to be zero or one. In a conventional RDS receiver or FM multiplex receiver, therefore, errors in data demodulated by the demodulating circuit are corrected to improve correctness of the data.

Although a bit is originally one and the level of the bit is near unity, a conventional demodulating circuit judges the bit to be zero when the level is below one. When the error correctability of an error correcting circuit covers the number and positions of such erroneous bits, the errors are completely corrected. However, if the number and positions are beyond the range of error correctability, the error correction becomes impossible. For example, the error correcting circuit of an RDS receiver can correct five erroneous bits when the interval of the erroneous bits is five bits or less, but cannot even correct two erroneous bits when the interval becomes more than five bits. This is because this error correction circuit is designed for correcting a burst error which includes consecutive error bits.

SUMMARY OF THE INVENTION

The purpose of the invention is to improve the error correctability by using a reliability information bit.

In the present invention, all possible patterns of demodulated data are generated based on the reliability information bit indicating the correctness of the demodulated data. An error correcting circuit carries out error correction for all patterns of demodulated data. Therefore, even when errors in the demodulated data are beyond its error correctability, they can be perfectly corrected.

When a plurality of patterns of successfully corrected data exist, the distance between signals of a result of the error correction and the demodulated data is measured. A minimum value of the measured intersignal distance is determined. A pattern of data derived from the minimum value of the intersignal distance is used as a final result of the error correction, obtaining more accurately corrected data.

In addition, the reliability information bit, indicating the correctness of the demodulated data, is outputted from the demodulating circuit. The number of the reliability information bits having a predetermined level is counted by a bit number judging circuit. When the number is not above a predetermined value, all possible patterns of demodulated data are generated. The error correcting circuit carries out error correction for all patterns of demodulated data . Therefore, even when errors in the demodulated data are beyond its error correctability, they can be perfectly corrected. When the number is above the predetermined value, in contrast, usual error correction is carried out. Therefore, when the demodulated data are too inaccurate, miscorrection of errors which arises from using the reliability information bit is prevented.

BRIEF DESCRIPTION OF THE DRAWINGS

FIG. 4 shows the principle of measuring the distance between signals according to a preferred embodiment of the present invention.

DESCRIPTION OF THE PREFERRED EMBODIMENTS

Figure 1:
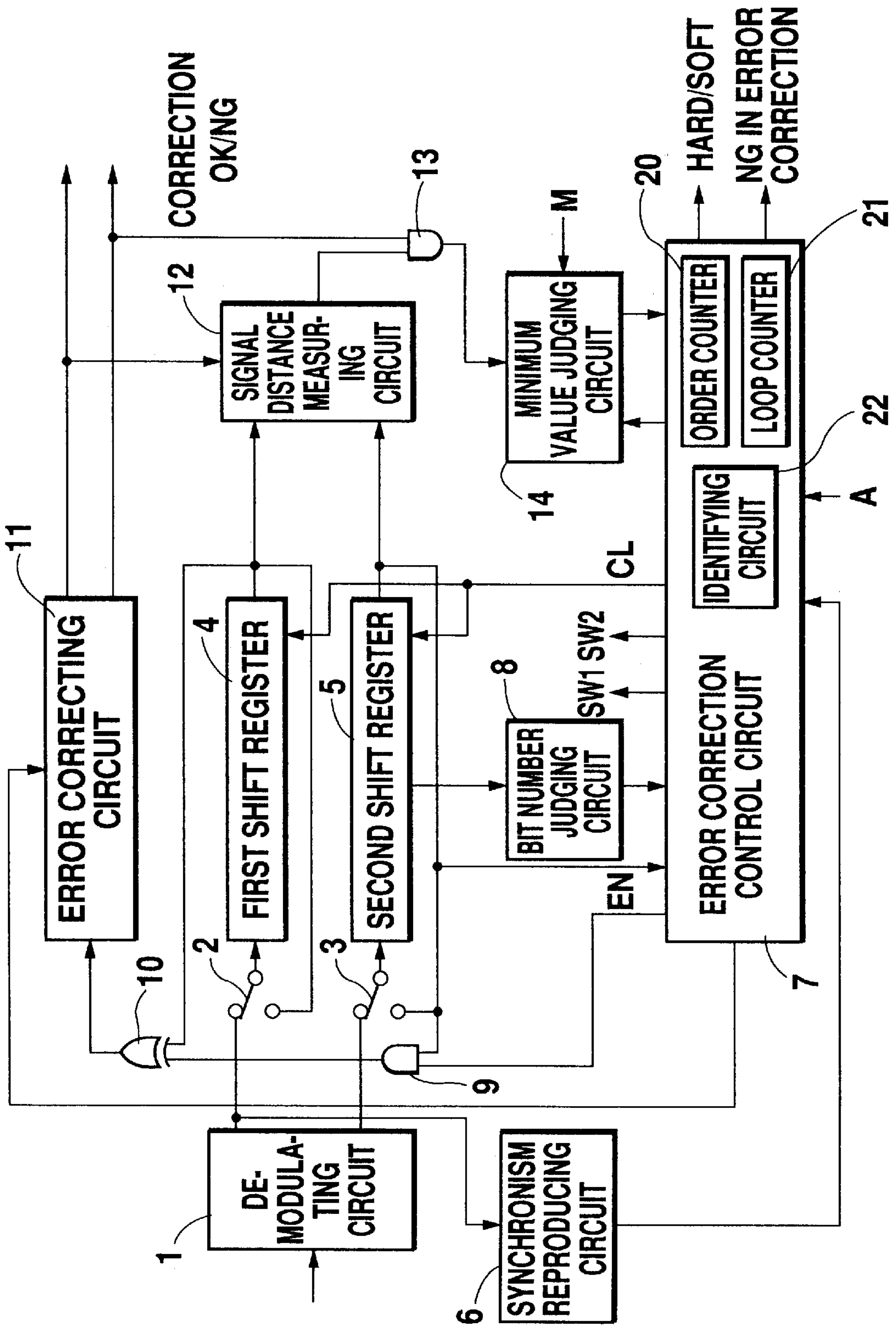
FIG. 1 shows a block diagram of a structure according to a preferred embodiment of the present invention.

FIG. 1 shows a block diagram of a structure according to a preferred embodiment of the present invention. Error correction of an RDS signal is exemplified. A data block of the RDS signal is totally composed of 26 bits including an error correction bit.

In FIG. 1, a demodulating circuit 1 demodulates a received RDS signal, and outputs a block of a pattern of demodulated data and a block of reliability information bits T indicating correctness of each corresponding bit in the pattern of demodulated data. A first shift register 4, operated in a 26 bit configuration, takes a block of the pattern of demodulated data via a switch 2, and repeats the shift operation of the taken pattern of demodulated data plural times. A second shift register 5, operated in a 26 bit configuration, takes 26 reliability information bits, corresponding to a block of the pattern of demodulated data, via a switch 3, and repeats the shift operation of the taken 26 reliability information bits plural times. A synchronism reproducing circuit 6 generates a synchronized timing signal based on the demodulated data. An error correction control circuit 7 controls error correction. A bit number judging circuit 8 judges the number of reliability information bits of Level 1 which have been supplied to the second shift register 5. An AND gate 9 controls the passing of reliability information bits outputted from the second shift register 5 according to an enable signal EN outputted from the error correction control circuit 7. An EXOR gate 10 makes an exclusive logical sum of output signals of the first shift register 4 and AND gate 9. An error correcting circuit 11 corrects errors in data inputted from the EXOR gate 10. A signal distance measuring circuit 12 determines an intersignal distance, the distance between a result of the error correction in the error correcting circuit 11 and the demodulated data supplied from the first shift register 4, based on the reliability information bits supplied from the second shift register. The intersignal distance of data whose errors have successfully been corrected, is inputted to a minimum value judging circuit 14 via the AND gate 13. The minimum value judging circuit 14 judges a minimum value of the inputted intersignal distances.

The switches 2 and 3 are switched by switching signals SW1 and SW2 supplied from the error correction control circuit 7. The shift registers 4 and 5 synchronously carry out the shift operation in response to the same clock signal supplied from the error correction control circuit 7.

The error correction control circuit 7 has a loop counter 21 for counting the number of cycles of the shift operation carried out by the shift registers 4 and 5, an order counter for counting the number of reliability information bits of Level 1 outputted from the second shift register 5 during one cycle, and an identifying circuit 22 for identifying whether the number n of bits judged by the bit number judging circuit 8 is larger than a reference value N. The reference value N is set at 2 or 4 bits by an external control signal A.

The minimum value judging circuit 14 compares an intersignal distance m inputted via the AND gate 13 with a reference value M. Only when the inputted intersignal distance m is smaller than the reference value M, is it judged as to whether the intersignal distance m is smaller than a minimum value already stored. When the newly inputted intersignal distance m is smaller, the minimum value is replaced with it. In FIG. 1, a correction OK/NG signal indicating success in error correction in the error correcting circuit 11 is inputted to the AND gate 13 connected to the input terminal of the minimum value judging circuit 14. The intersignal distance of a pattern of demodulated data whose errors have successfully been corrected is only inputted to the minimum value judging circuit 14. Alternatively, only the intersignal distance of a pattern of demodulated data whose errors have successfully been corrected may be measured.

The operation of a device according to this preferred embodiment will be described with reference to FIGS. 2, 3 and 4.

Figures 2, 3:
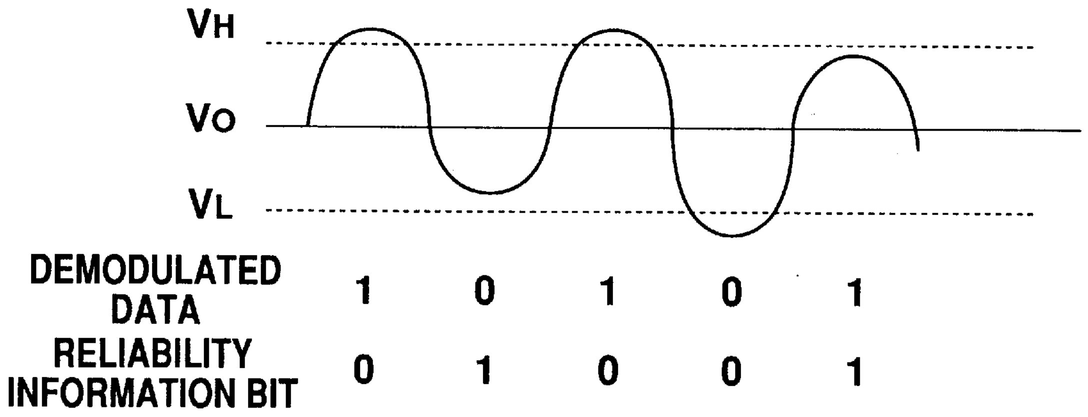
FIG. 2 represents the operation of a demodulating circuit according to a preferred embodiment of the present invention.
FIG. 3 represents various patterns of data according to a preferred embodiment of the present invention.

As shown in FIG. 2, the demodulating circuit 1 compares the level of a received analog signal with a first threshold level V0. When the level of the received signal is equal to the first threshold level V0 or higher, a demodulated data of Level 1 is outputted. When the level is lower than the first threshold level V0, a demodulated data of Level 0 is outputted. In addition, the demodulating circuit 1 compares the level of the received signal with second and third threshold levels VH and VL in order to detect correctness of the demodulated data. When the level of the received signal is higher than the second threshold level VH, or lower than the third threshold level VL, a reliability information bit of Level 0 is outputted. When the level of the received signal is in the range of VL to VH, a reliability information bit of Level 1 is outputted. Accordingly, when the correctness of the demodulated data is higher, the reliability information bit becomes Level 0, whereas, when the correctness is lower, it becomes level 1.

Here, a pattern of the original data of the received signals is DD, and a pattern of demodulated data D0 and a series T0 of reliability information bits corresponding to the pattern of demodulated data D0 are outputted from the demodulating circuit 1, as shown in FIG. 3.

When the demodulated data and reliability information bits are outputted, the error correction control circuit 7 makes both the switching signals SW1 and SW2 Level 1. The switches 2 and 3 in FIG. 1 are turned up. A block composed of 26 bits of the pattern of demodulated data and another block of the 26 reliability information bits are supplied to the first and second shift registers 4 and 5, respectively. When the respective blocks are supplied, the error correction control circuit 7 causes the switching signals SW1 and SW2 to become Level 0. The switches 2 and 3 in FIG. 1 are turned down so that outputs of the first and second shift registers 4 and 5 are fed back to themselves, respectively. The supplied blocks of data can be cyclically shifted.

The bit number judging circuit 8 judges the number n of reliability information bits at Level 1 out of all the reliability information bits supplied to the second shift register 5. The number n of the reliability information bits of Level 1 is supplied to the error correction control circuit 7, and it is identified whether the number n is larger than the reference value N. When the number n is larger than the reference value N, usual error correction without using the reliability information bit (called "error correction by hard decision" hereinafter) is carried out. When the number n is equal to or less than the reference value N, the error correction using the reliability information bit (called "error correction by soft decision" hereinafter) is carried out. The error correction judging circuit 7 generates control signal hard/soft, so that the next section is informed whether the error correction is carried out by the hard or soft decision.

When the reliability information bit is Level 1, a corresponding demodulated data can be either 1 or 0. Therefore, when the error correction by soft decision is carried out, all the possible patterns of demodulated data are generated, and the error correction is carried out for all possible combinations of the patterns of demodulated data In the example shown by D0 and T0 in FIG. 3 (demodulated data 0), the twelfth and twentieth bits out of the 26 bits of demodulated data are Level 0, and have corresponding reliability information bits of Level 1. The possible bit pattern of these two bits are "00", "10", "01" and "11". All possible patterns of the demodulated data are four patterns of D1 to D4 shown in FIG. 3. The error correction by soft decision is successively carried out for the four patterns.

When the bit number judging circuit 8 judges the number of reliability information bits as n, the number of all possible combinations is $2^n$. The error correction circuit 11 repeatedly carries out processing $2^n$ times. Therefore, the first and second shift registers need to perform the cyclic shift operation $2^n$ times. The number of the repeated cyclic shift operations is counted by the loop counter 21 in the error correction control circuit 7. The order counter 20 in the error correction control circuit 7 counts the number of reliability information bits at Level 1 existing in one cycle. The error correction control circuit 7 controls the enable signal EN supplied to the AND gate 9 according to the contents of the loop counter 21 and order counter 20.

In the first cycle, during which the count of the loop counter is zero, the second shift register 5 outputs the twelfth reliability information bit of Level 1, and then the content of the order counter becomes one. The error correction control circuit 7 makes the enable signal Level 0. The reliability information bit of Level 1 is not permitted to pass through the AND gate 9. The output of the AND gate 9 remains zero. The EXOR gate 10 outputs the original demodulated data 0. When the second shift register 5 outputs the twentieth reliability information bit of Level 1 after further proceeding of the shift operation, the count of the order counter becomes two. At this time, the error correction control circuit 7 makes the enable signal EN Level 0. Both the outputs of the AND gate 9 and EXOR gate 10 becomes zero, and the first shift register 4 outputs the original demodulated data 0, as described before. When the second shift register 5 outputs a signal of Level 0, the output of the AND gate 9 is always zero. The EXOR gate 10 unchangedly outputs the demodulated data outputted from the first shift register 4.

Accordingly, the pattern of data D1 identical to the original demodulated data shown by (d) in FIG. 3 is inputted to the error correcting circuit 11 in the first cycle of the shift operation. Error correction is carried out for the pattern of data.

In the second cycle of the shift operation, the content of the loop counter 21 becomes "1". When the second shift register 5 outputs the twelfth bit of "1", the content of the order counter 20 becomes "1". At this time, the error correction control circuit 7 makes the enable signal EN Level 1. Consequently, the output of the AND gate 9 becomes "1", and then the demodulated data 0 outputted from the first shift register 4 is inverted to one by the EXOR gate 10. When the content of the order counter 20 becomes "2" by outputting the twentieth bit Of "1", the error correction control circuit 7 makes the enable signal EN Level 0. The demodulated data 0 is directly outputted from the EXOR gate 10. In the second cycle, the data pattern D2 shown by (e) in FIG. 3 is inputted to the error correcting circuit 11.

In the third cycle, when the content of the loop counter 21 becomes "2", and that of the order counter 20 becomes "1", the enable signal EN is made Level 0. When the content of the order counter 20 becomes "2", the enable signal EN is made Level 1. Therefore, the data pattern D3 shown in FIG. 3, which has the twelfth bit of "0" and the twentieth bit of "1", is outputted from the EXOR gate 10. In the last fourth cycle, when the content of the loop counter 21 becomes "3", and that of the order counter becomes either "1" or "2", the enable signal EN is made level 1. Therefore, the pattern of data D4 shown in FIG. 3, which has the twelfth bit of "1" and the twentieth bit of "1", is outputted from the EXOR gate 10.

Such four types of pattern of data D1, D2, D3 and D4 are successively inputted to the error correcting circuit 11, and error correction is successively carried out for the inputted patterns of data. When the error correction succeeds, the correction OK/NG signal becomes "1", whereas, when the error correction fails, it becomes "0". If the error correction succeeds for only one of plural patterns of data, the result of the error correction is used as a final one. If the error correction succeeds for two or more patterns of data, further data processing is carried out, as follows:

The error-corrected data, and the demodulated data from the first shift register 4 and corresponding reliability information bits from the second shift register are inputted to the signal distance measuring circuit 12. The intersignal distance, distance between the error-corrected data and demodulated data for each bit, is calculated on a principle shown in FIG. 4. The intersignal distances for all bits in a data block are summed up to determined the intersignal distance of a pattern of data. Only the intersignal distance of a pattern of successfully error-corrected data is supplied to the minimum value judging circuit 14 via the AND gate 13. A minimum value is judged by the method described before. The error correction control circuit 7 stores a value contained in the loop counter 21, which corresponds to a minimum intersignal distance. The value is set in the loop counter 21 again. The pattern of data whose intersignal distance is minimum, is generated again, and supplied to the error correcting circuit 11. A result of the error correction for this pattern of data supplied to the next section as a final one.

In the example shown in FIG. 3, the error correction for the patterns of data D2, D3 and D4 succeeds, obtaining results DC1, DC2 and DC3 shown in FIG. 3, respectively. The intersignal distances for the patterns of data are determined according to FIG. 4. They are 10, 9 and 10, respectively. In this case, the minimum value judging circuit 14 chooses 9 as a minimum value, and the result DC2 of the error correction for the pattern of data D3 corresponding to the minimum value 9 is employed as a final one.

The error correction is carried out twice for a pattern of data, whose intersignal distance is minimum, in the above described preferred embodiment. Alternatively, results of the error correction for the respective patterns of data are stored in a buffer memory during the error correction operation. A result of the error correction of a pattern of data whose intersignal distance is minimum, may be read out from the buffer memory. Alternatively, only when an intersignal distance is judged to be smaller than an already stored minimum value, is the result of the error correction stored in the buffer memory rewritten, and a result finally left in the buffer memory may be employed as a final result of the error correction.

When the minimum value judging circuit 14 judges all intersignal distances of patterns of data to be larger than the reference value M, an initial value is left as the minimum value. The error correction control circuit 7 outputs an error correction NG signal indicating that the error correction fails, to the next section, so that the next section does not employ the outputted result of the error correction.

The error correction by hard decision is described hereinafter. This is performed when the number n of bits counted by the bit number judging circuit 8 is larger than the reference value N.

The number n of bits larger than the reference value N shows that the demodulated data are very unreliable. When the error correction by soft decision is carried out under such conditions, errors can be very probably miscorrected. Instead, this causes the number of error corrections to increase. In this preferred embodiment, the error correction by hard decision is carried out under the conditions that the number n of bits is larger than the reference value N.

In the error correction by hard decision, the error correction control circuit 7 always outputs the enable signal EN of Level 0. The output of the AND gate is always zero. Consequently, the output of the first shift register 4 passes directly through the EXOR gate 10. In the error correction by hard decision, only the demodulated data outputted from the demodulating circuit 1 are inputted to the error correcting circuit 11. No other patterns of demodulated data are generated. The result of this error correction is supplied to the next section as a final one.

While there have been described what are at present considered to be preferred embodiments of the present invention, it will be understood that various modifications may be made thereto, and it is intended that the appended claims cover all such modifications as fall within the true spirit and scope of the present invention.

What is claimed is:

1. An error correction device comprising:

a demodulating circuit for demodulating an input signal to output patterns of demodulated data, and for outputting a reliability information bit, which indicates correctness of the respective demodulated data in the pattern, corresponding to the demodulated data;

an error correcting circuit for correcting errors existing in the pattern of demodulated data; and a control circuit for controlling error correction for the pattern of demodulated data according to the reliability information bit, a bit number judging circuit for judging the number of reliability information bits having a predetermined level out of all the outputted reliability information bits, wherein the control circuit controls the error correction according to the number of reliability information bits judged by the bit number judging circuit, wherein the control circuit includes a generating circuit for detecting demodulated data whose corresponding reliability information bit has a predetermined level and for generating patterns of demodulated data which are derived from all possible combinations made using the detected demodulated data, and the error correcting circuit carries out error correction for all the patterns of demodulated data which are generated from the combinations.

2. An error correction device in accordance with claim 1, wherein the control circuit determines whether the number of reliability information bits judged by the bit number judging circuit is larger than a predetermined value, and controls so that the patterns of demodulated data generated from the combinations are supplied to the error correcting circuit when the number of reliability information bits judged by the bit number judging circuit is not larger than the predetermined value, or only the pattern of the demodulated data inputted from the demodulating circuit is supplied to the error correcting circuit when the number of reliability information bits judged by the bit number judging circuit is larger than the predetermined value.

3. An error correction device in accordance with claim 1, wherein the bit number judging circuit includes first and second shift registers for taking the pattern of demodulated data and the reliability information bits, respectively, and for synchronously performing a shift operation, and determines whether the number n of reliability information bits having a predetermined level, out of the reliability information bits taken into the second shift register, is larger than a predetermined value.

4. An error correction device in accordance with claim 1, wherein the generating circuit includes a bit data generating circuit for receiving the reliability information bits having the predetermined level, and for successively outputting bit data derived from all possible combinations of demodulated data corresponding to the reliability information bits having the predetermined level, and a logical circuit for converting the demodulated data, which exist in the pattern of demodulated data and correspond to the reliability information bits having the predetermined level, to bit data made from all the combinations, and for successively outputting the patterns of demodulated data derived from all the combinations.

5. An error correction device in accordance with claim 4, wherein the bit data generating circuit includes a first counter for counting the number of cycles of the shift operation which is cyclically carried out by the respective first and second shift registers $2^n$ times, and a second counter for counting the number of reliability information bits having the predetermined level which appear during one cycle of the shift operation, receives the reliability information bits having the predetermined level, and successively outputs bit data derived from all possible combinations of demodulated data corresponding to the reliability information bits having the predetermined level according to the contents of the first and second counters in every cycle, and the logical circuit converts the demodulated data corresponding to the reliability information bits having the predetermined level to the successively outputted bit data in every cycle, and successively outputs the patterns of demodulated data derived from all the combinations to the error correcting circuit.

6. An error correction device in accordance with claim 1 further comprising:

a signal distance measuring circuit for measuring an intersignal distance between a signal of the demodulated data and a result of at least one of the patterns of demodulated data whose errors the error correcting circuit succeeds in correcting; and a minimum value judging circuit for judging a minimum value of the intersignal distances for the patterns of demodulated data whose errors are successfully corrected from the results of intersignal measurements, wherein a result from the error correction of the pattern of demodulated data corresponding to a minimum intersignal distance is outputted as a final result of the error correction.

7. An error correction device in accordance with claim 6, wherein the minimum value judging circuit has at least a judging circuit for judging whether the minimum value is larger than a predetermined value or not, and the judging circuit outputs a control signal when the minimum value is larger than the predetermined value.

8. An error correction device in accordance with claim 7, wherein the signal distance measuring circuit measures the intersignal distance based on the result of the error correction, and the demodulated data and reliability information bits supplied from the demodulating circuit.

9. An error correction device in accordance with claim 1, wherein the input signal is an RDS broadcasting signal or a multiplex FM signal.

* * * * *